(12) United States Patent
Van Os et al.

(10) Patent No.: US 12,386,088 B2
(45) Date of Patent: Aug. 12, 2025

(54) ACOUSTIC TRANSDUCER WITH TRAPEZOIDAL, IRREGULARLY PITCHED, OR WIDENED TRANSDUCER ELEMENTS

(71) Applicant: Schlumberger Technology Corporation, Sugar Land, TX (US)

(72) Inventors: Roel Van Os, Clamart (FR); Hiroshi Hori, Clamart (FR); Orland Guedes, Clamart (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 109 days.

(21) Appl. No.: 18/341,824

(22) Filed: Jun. 27, 2023

(65) Prior Publication Data

US 2025/0004152 A1 Jan. 2, 2025

(51) Int. Cl.
 *G01V 1/20* (2006.01)
 *G01V 1/02* (2006.01)
 *H03H 9/205* (2006.01)

(52) U.S. Cl.
 CPC ............... *G01V 1/20* (2013.01); *G01V 1/159* (2013.01); *H03H 9/205* (2013.01)

(58) Field of Classification Search
 CPC . G01V 1/20; G01V 1/59; G01V 1/159; H03H 9/205; E21B 47/00; E21B 47/0025; B06B 1/00
 USPC ........................................................ 367/86
 See application file for complete search history.

(56) References Cited

U.S. PATENT DOCUMENTS

| | | | | |
|---|---|---|---|---|
| 4,580,252 A | * | 4/1986 | Mallett | B06B 1/0607 181/104 |
| 5,164,920 A | * | 11/1992 | Bast | B06B 1/0622 600/459 |
| 2007/0206440 A1 | * | 9/2007 | Fripp | E21B 47/16 367/157 |
| 2021/0247538 A1 | * | 8/2021 | Guedes | G01S 15/8945 |

FOREIGN PATENT DOCUMENTS

| | | | | |
|---|---|---|---|---|
| GB | 2287789 A | * | 9/1995 | ........... B06B 1/0633 |
| WO | WO-2017086933 A1 | * | 5/2017 | ............. E21B 47/00 |

* cited by examiner

*Primary Examiner* — Yuqing Xiao
*Assistant Examiner* — Christopher Richard Walker
(74) *Attorney, Agent, or Firm* — Jeffrey D. Frantz (57) ABSTRACT a Downhole Acoustic Measurement Tool that Includes a Transducer Operable for Emitting and/or Receiving Acoustic Signals to Perform Downhole Measurements. The Transducer Includes Multiple Piezoelectric Elements. Each Piezoelectric Element May have a First Axial End and a Second Axial End, and the Second Axial End May be Wider than the First Axial End in a Direction Along a Circumference of the Transducer. The Piezoelectric Elements May be Irregularly Pitched Azimuthally Around One or More Portions of a Circumference of the Transducer. The Piezoelectric Elements May be Spaced Apart by No More than the Distance Defined by $W1*f1/F_{UL}$, where $F_{UL}$ is the Upper Limit of the Frequency Band of Interest, W1 is the Width of the Transducer Interelement Spacing that Produces Parasitic Mode at Frequency f1.

17 Claims, 6 Drawing Sheets

ACOUSTIC TRANSDUCER WITH TRAPEZOIDAL, IRREGULARLY PITCHED, OR WIDENED TRANSDUCER ELEMENTS

BACKGROUND OF THE DISCLOSURE

Acoustic downhole imaging tools are used in oil and gas exploration and production (E&P) in both cased and uncased ("open") boreholes. For example, when utilized in cased boreholes, such acoustic imaging is performed to inspect the casing and the cement securing the casing in the borehole. When utilized in open boreholes, acoustic imaging may be performed to obtain an image of the borehole surface, such as to identify vugs, fractures, texture, and acoustic properties of the subterranean formation penetrated by the borehole.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces an apparatus including a downhole acoustic measurement tool that includes a transducer. The transducer is operable for emitting and/or receiving acoustic signals to perform downhole measurements. The transducer includes piezoelectric elements each having a first axial end and a second axial end. The second axial end is wider than the first axial end in a direction along a circumference of the transducer.

The present disclosure also introduces an apparatus including a downhole acoustic measurement tool that includes a transducer operable for emitting and/or receiving acoustic signals to perform downhole measurements. The transducer includes piezoelectric elements that are irregularly pitched azimuthally around one or more portions of a circumference of the transducer.

The present disclosure also introduces an apparatus including a downhole acoustic measurement tool that includes a transducer operable for emitting and/or receiving acoustic signals to perform downhole measurements. The transducer includes piezoelectric elements that are spaced at a controlled distance by spacer made of electrically insulating and mechanically compliant material, for an example, resin or elastomer or their composite material.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numbers and/or letters in the various examples. This repetition is for simplicity and clarity and does not in itself dictate a relationship between the various embodiments and/or configurations discussed. Moreover, the description of a first feature in contact with a second feature in the description that follows may include implementations in which the first and second features are in direct contact, and may also include implementations in which additional features may interpose the first and second features, such that the first and second features may not be in direct contact.

Figure 1:
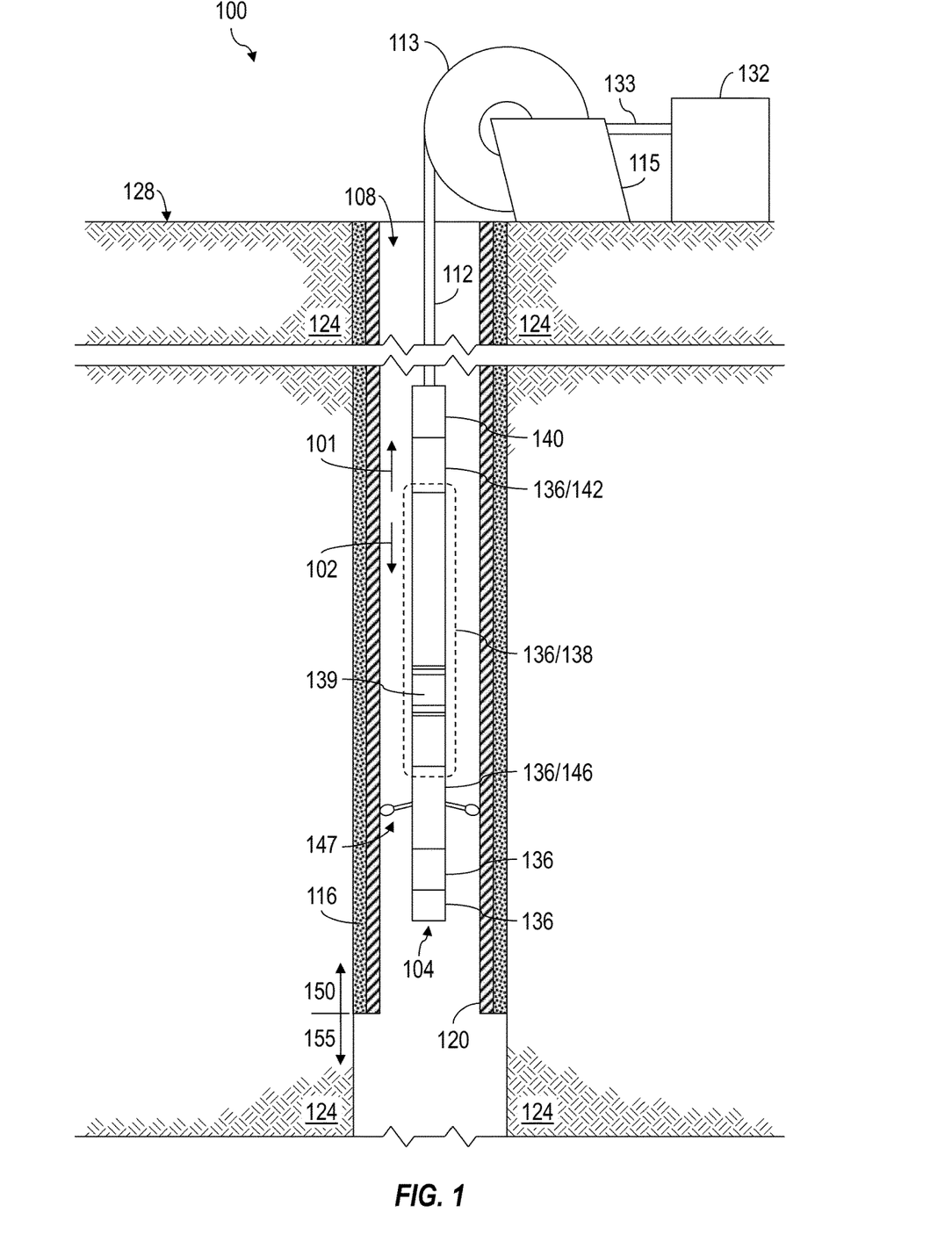
FIG. 1 is a schematic view of at least a portion of an example implementation of apparatus according to one or more aspects of the present disclosure.

FIG. 1 is a schematic view of at least a portion of an example implementation of a wellsite system 100 to which one or more aspects of the present disclosure may be applicable. The wellsite system 100 may be onshore (as depicted) or offshore. In the example wellsite system 100 shown in FIG. 1, a toolstring 104 is conveyed in a borehole 108 via a wireline, slickline, and/or other conveyance means 112. The example wellsite system 100 may be utilized for evaluation of the borehole 108, cement 116 securing casing 120 within the borehole 108, a tubular (not shown) secured in the casing 120 (e.g., production services tubing), and/or a subterranean formation 124 penetrated by the borehole 108 in a cased section 150 and/or an open hole section 155. Although the majority of the wellbore 108 is depicted in FIG. 1 as being cased, a majority of the wellbore may be uncased ("open," without the casing 120 and cement 116).

The toolstring 104 is suspended in the borehole 108 from the lower end of the conveyance means 112. The conveyance means 112 may be a single- or multi-conductor slickline or wireline logging cable spooled on a drum 113 of a winch 115 at the surface 128 of the wellsite from whence the borehole 108 extends. The wellsite surface 128 is the generally planar surface of the terrain (i.e., Earth's surface), a floor of a rig (not shown) at the wellsite, or other equipment at the wellsite, which is perpendicularly penetrated by the borehole 108. Operation of the winch 115 rotates the drum 113 to reel in the conveyance means 112 and thereby pull the toolstring 104 in an uphole direction 101 in the borehole 108, as well as to reel out the conveyance means 112 and thereby move the toolstring 104 in a downhole direction 102 in the borehole 108. The conveyance means 112 may include at least one or more conductors (not shown) that facilitate data communication between the toolstring 104 and surface equipment 132 disposed at the wellsite surface 128, including through one or more slip rings, cables, and/or other conductors (schematically depicted in FIG. 1 by reference number 133) electrically connecting the one or more conductors of the conveyance means 112 with the surface equipment 132. The conveyance means 112 may alternatively transport the tool string without a conductor inside the cable but with at least one module that can autonomously acquire and/or process and/or store downhole measurements in downhole memory without human intervention or communication with the surface equipment 132.

Although not illustrated as such in FIG. 1, the winch 115 may be disposed on a service vehicle or a stationary skid/platform. The service vehicle or stationary skid/platform may also contain at least a portion of the surface equipment 132.

The toolstring 104 comprises a plurality of modules 136, one or more of which may comprise an elongated housing, mandrel, chassis, and/or structure carrying various electronic and/or mechanical components. For example, at least one of the modules 136 may be or comprise at least a portion of a device for measuring a feature and/or characteristic of the borehole 108, the casing 120, a tubular installed in the casing 120 (not shown), the cement 116, and/or the formation 124, and/or a device for obtaining sidewall or inline core and/or fluid (liquid and/or gas) samples from the borehole 108 and/or formation 124. Other implementations of the downhole toolstring 104 within the scope of the present disclosure may include additional or fewer components or modules 136 relative to the example implementation depicted in FIG. 1.

The wellsite system 100 also includes a data processing system that may include at least a portion of one or more of the surface equipment 132, control devices and/or other electrical and/or mechanical devices in one or more of the modules 136 of the toolstring 104 (such as a downhole controller 140), a remote computer system (not shown), communication equipment, and/or other equipment. The data processing system may include one or more computer systems or devices and/or may be a distributed computer system. For example, collected data or information may be stored, distributed, communicated to a human wellsite operator, and/or processed locally (downhole or at surface) and/or remotely.

The data processing system may, whether individually or in combination with other system components, perform the methods and/or processes described below, or portions thereof. For example, the data processing system may include processor capability for collecting caliper, acoustic, ultrasonic, and/or other data related to the evaluation of the cement 116, the casing 120, a tubular installed in the casing 120 (not shown), and/or the formation 124, according to one or more aspects of the present disclosure. Methods and/or processes within the scope of the present disclosure may be implemented by one or more computer programs that run in a processor located, for example, in one or more modules 136 of the toolstring 104 and/or the surface equipment 132. Such programs may utilize data received from the downhole controller 140 and/or other modules 136 and may transmit control signals to operative elements of the toolstring 104, where such communication may be via one or more electrical or optical conductors of the conveyance means 112. The programs may be stored on a tangible, non-transitory, computer-usable storage medium associated with the one or more processors of the downhole controller 140, other modules 136 of the toolstring 104, and/or the surface equipment 132, or may be stored on an external, tangible, non-transitory, computer-usable storage medium that is electronically coupled to such processor(s). The storage medium may be one or more known or future-developed storage media, such as a magnetic disk, an optically readable disk, flash memory, or a computer-readable device of another kind, including a remote storage device coupled over one or more wired and/or wireless communication links, among other examples.

As designated in FIG. 1 by reference number 138, at least one of the modules 136 may be or comprise a downhole acoustic measurement tool operable for acquiring acoustic measurements characterizing the borehole 108, the casing 120, a tubular installed in the casing 120 (not shown), the cement 116, and/or the formation 124. The downhole acoustic measurement tool 138 comprises a phased array module 139 of acoustic transducers ("active elements") that may each be operated as an acoustic transmitter and/or receiver. Example implementations of the downhole acoustic measurement tool 138 within the scope of the present disclosure are described below.

As designated in FIG. 1 by reference number 142, another one (or more) of the modules 136 may be or comprise an orientation module permitting measurement of the azimuth of the downhole acoustic measurement tool 138. Such module 142 may include, for example, one or more of a relative bearing (RB) sensor, a gravity/acceleration sensor, a magnetometer, and a gyroscopic sensor.

As designated in FIG. 1 by reference number 146, another one (or more) of the modules 136 may be or comprise a centralizer module. For example, the centralizer module 146 may comprise an electric motor driven by a controller (neither shown) and/or other means for actively extending ("opening") and retracting ("closing") a plurality of centralizing arms 147. Although only two centralizing arms 147 are depicted in the example implementation shown in FIG. 1, other implementations within the scope of the present disclosure may have more than two centralizing arms 147. Extension of the centralizing arms 147 aids in urging the downhole acoustic measurement tool 138 to a central position within the casing 120, another tubular, or the borehole 108 being investigated by the downhole acoustic measurement tool 138. Implementations of toolstrings within the scope of the present disclosure may include more than one instance of the downhole acoustic measurement tool 138 and/or more than one instance of the centralizer module 146. The modules 136 may be conveyed in either or both of open-hole sections 150 and cased-hole sections 155, including implementations in which the centralizer module 146 and the phased array module 138 may be configured or configurable for use in either or both of the two sections. The toolstring 104 may also not comprise the centralizer module 146, or may comprise another type of centralizer module, such as a passive centralizer module.

Figure 2:
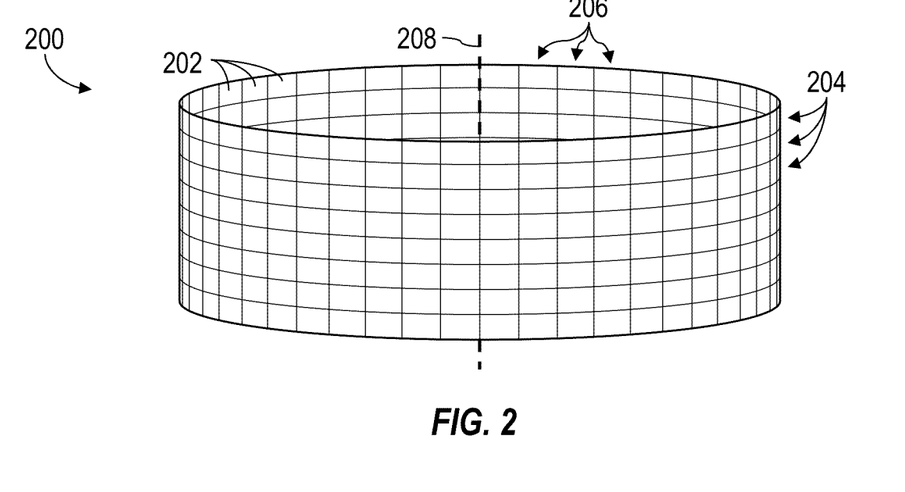
FIG. 2 is a perspective view of an example implementation of a portion of the apparatus shown in FIG. 1.

FIG. 2 is a perspective view of at least a portion of an example implementation of active elements 202 of a phased array 200 that is a part of the acoustic measurement tool 138 according to one or more aspects of the present disclosure. The phased array 200 is an example implementation of the phased array module 139 shown in FIG. 1. The phased array 200 permits obtaining azimuthal measurements relative to the borehole, perhaps without mechanical rotation of the downhole acoustic measurement tool 138.

The example phased array 200 depicted in FIG. 2 comprises active elements 202 arranged in one or plural rows 204 and plural columns 206 extending around a central axis 208. However, implementations of the phased array 200 and other phased arrays within the scope of the present disclosure may include different numbers (including one) of rows 204 and/or columns 206. The phased array 200 may be configured such that the transducer elements 202 are collectively disposed azimuthally around a substantial portion (e.g., more than 50%) of the tool, perhaps the entire periphery of the tool, as depicted in FIG. 2. However, the phased array 200 may include one or plural segments 210 that consists of plural elements 202, as depicted by the phased array 201 shown in FIG. 3. Azimuthal and axial elements 202 numbers depicted in one segment 210 are identical as an example. Other implementations of different numbers of elements 202 along azimuthal and axial direction are also within the scope of the present disclosure. The phased array 201 can be made of plural segments 210 that consists of different numbers of elements, are also within the scope of the present disclosure. The minimum number of elements 202 in the segment 210 along the orthogonal direction to azimuthal or axial phased array is 1. The segments 210 may also be immediately adjacent to one another, but they may also be spaced apart azimuthally and or axially with overlapping or non-overlapping elements in axial or azimuthal direction respectively. The shape of the segments 210 is not necessarily circumferentially rectangular as in FIG. 3.

The active part of acoustic transducers consists of a piezoelectric material. The shape of this piezoelectric element dictates the characteristics of the signals that the transducer emits and receives. However, in addition to the intended signal, the element can also generate parasitic signals that may be inherent to the shape of the element. These parasitic signals can hamper the application for which the transducer is built. Other potential parasitic signals can stem from the characteristics of the phased-array 200 or the segment 210 of which the piezoelectric element may be part, or of the general 3D structure of the phased-array or segment as shown later on in FIG. 10.

In the application of casing-thickness and annular impedance measurements for well-integrity evaluation, the frequency content of the signals from transducers is preferably wide-band and stable over a predefined range of frequencies. The piezoelectric elements are designed in a way that their emitted and received signal sensitivities are increased in the predefined range of frequencies thanks to their thickness-mode resonance. For such efficient emission and reception, the thickness of each element is preferably close to half the wavelength of the acoustic wave along thickness direction near the casing-thickness resonance frequency.

The other dimensions of the element are dictated by the intended spatial resolution, signal strength, and/or available space for the transducer and/or numbers of driving circuit switches and connectors that are available in the acoustic measurement tool 139. In multi-element phased array transducers, a certain number of elements are required, and their relative spacing (pitch) is determined by acoustics. These "secondary" elemental dimensions, in combination with the material properties of piezoelectric element, may excite unwanted signals at frequencies that are within the bandwidth of interest and that can be problematic for inverting signals from the casing 120 or another tubular 108 when their frequency bands are substantially close each other. The present disclosure introduces aspects that can be utilized to alleviate the parasitic modes.

Figure 4:
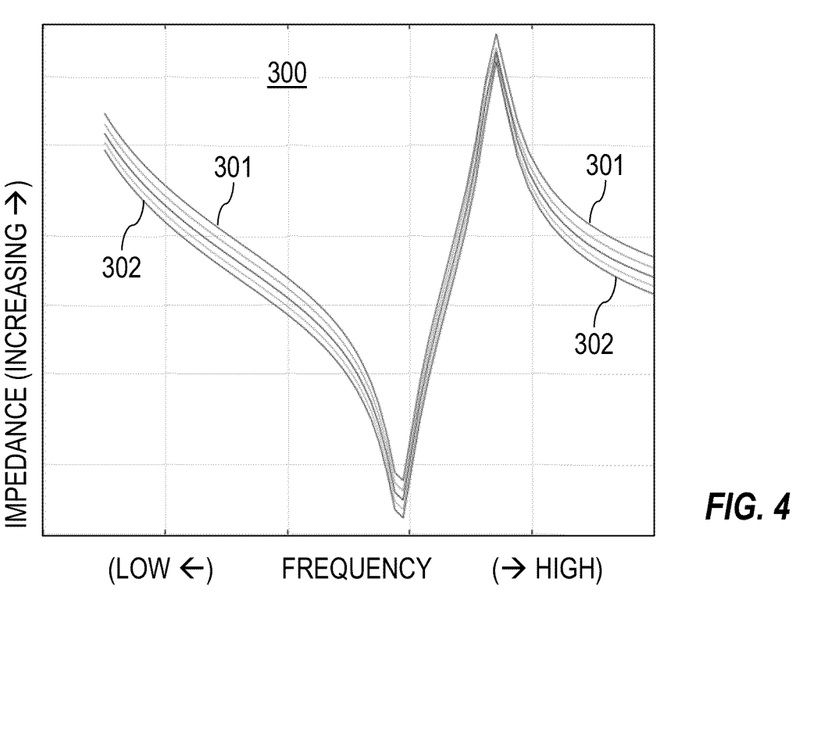
FIGS. 4 and 5 are graphs depicting one or more aspects of the present disclosure.

FIG. 4 is a graph depicting electrical impedance curves 300 resulting from numerical simulations of rectangular piezoelectric elements (or strips) in which just the thickness mode is permitted to exist. Each curve corresponds to the impedance curve of different width (ww) that is incremented by 11 percent of the minimum width 301. The impedance curves 300 vary from the one from the minimum width 301 to the one from the maximum width 302. The resulting impedance plot 300 confirms the idealized response, showing only resonant and anti-resonant peaks associated to the thickness resonance over the frequency band of interest for the measurement, and the width of the element having no appreciable changes in impedance curve shapes except the vertical offsets resulting from electrical capacitance increase proportional to the width of the element.

Figure 5:
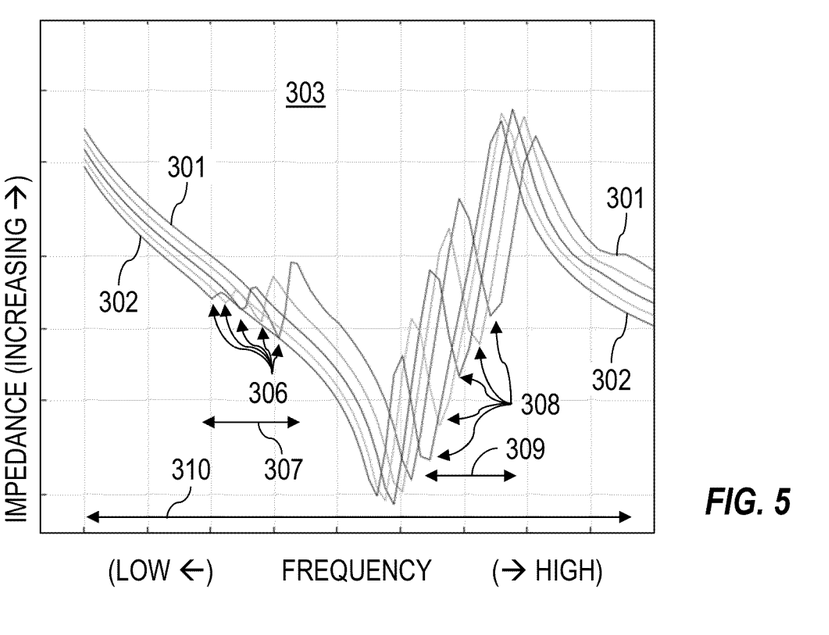

FIG. 5 is a graph depicting impedance curves 303 resulting from a similar numerical simulation allowing resonance modes also in the "secondary" elemental dimension, i.e. the width of the element. Parasitic modes 306, 308 are present, notably in the sub-frequency ranges 307, 309 of the frequency range of interest 310. A wider element may decrease the amplitude of one parasitic contribution, for example, the parasitic resonance present in the sub-frequency range 307 can be reduced by decreasing the width element, however, the higher-order parasitic modes in another sub-frequency band 309 are still present and are shifted to frequencies closer to the center of the frequency range of interest 306 in these examples.

Figure 6:
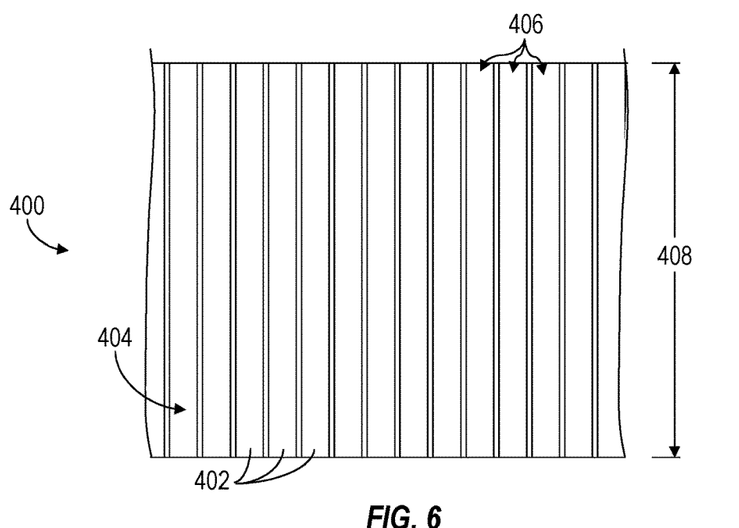
FIG. 6 is an unrolled view of an example implementation of a portion of the apparatus shown in FIG. 3.
Figure 7:
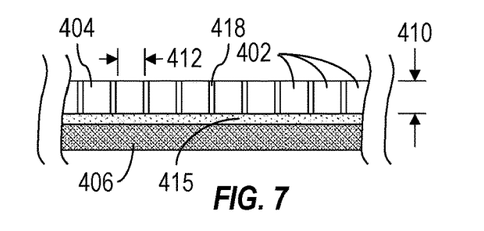
FIG. 7 is an end view of the apparatus shown in FIG. 6.

FIG. 6 depicts an example implementation of a multi-elemental transducer 400 according to one or more aspects of the present disclosure. The transducer 400 is similar in form and function to one of the segments of transducer 210 shown in FIG. 3. The transducer 400 can be a multi-element rectangular transducer. However, instead of rows 204 and columns 206 of active elements 202, the transducer 210 is presented in multiple columns 406 and single row 404 which does not limit having multiple rows along the axial length 408, as would be the case in a matrix-array. FIG. 6 depicts the transducer 400 as having been unrolled and lying flat on the surface of the page. FIG. 7 is an end view of the transducer 400, depicting the elements 402 as being members extending from a backing 406. Thickness 410 is set in such that the element excites its thickness mode resonance in the predetermined frequency range. Between the elements 402 and the backing 406, an interface layer 415 that consists of one or more materials may be present. The materials of the interface layer are, for example, piezoelectric, electrical conductor or an acoustic impedance matching layer. Space 418 between piezoelectric elements 402 is an inter-element that is filled with filler material having more compliant mechanical properties than that of the piezoelectric elements 402.

Figure 8A:
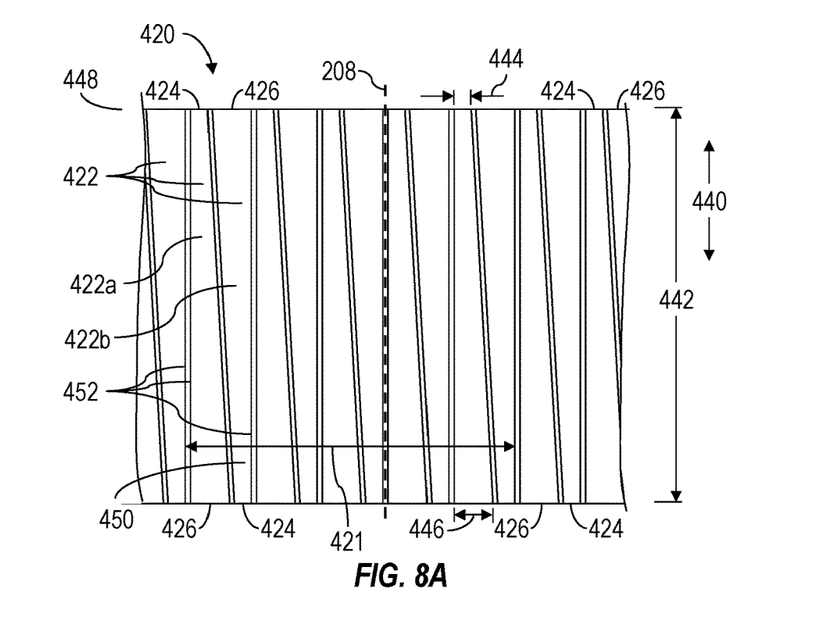
FIG. 8A is an unrolled view of another example implementation of the apparatus shown in FIG. 6.
Figure 8B:
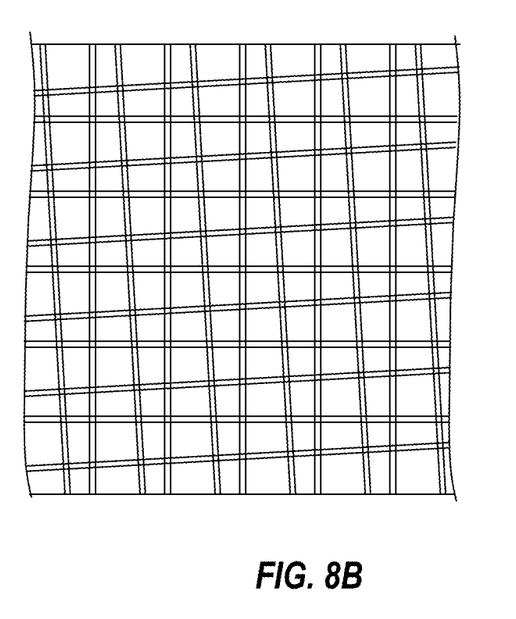
FIG. 8B is general matrix-array shape of an implementation of a transducer in 8A.

Under the constraint of the total number of column elements 406 being fixed, parasitic modes can be reduced by slightly tapering the rectangular elements 402, as depicted by the example transducer 420 in FIG. 8A. The transducer 420 can be a multi-element rectangular transducer. Again, only a single row is depicted, which does not limit having multiple rows along the axial length 442 in the direction 440, as would be the case in a matrix array. A general matrix-array shape is shown in FIG. 8B. The parasitic mode can be smeared out and efficiently destructed, as depicted in the impedance curves 304 shown in FIG. 9. In this particular example, the transducer 420 may have a rectangular outer-shape of the segment 210 depicted in FIG. 3 and of the total number of elements.

Figure 9:
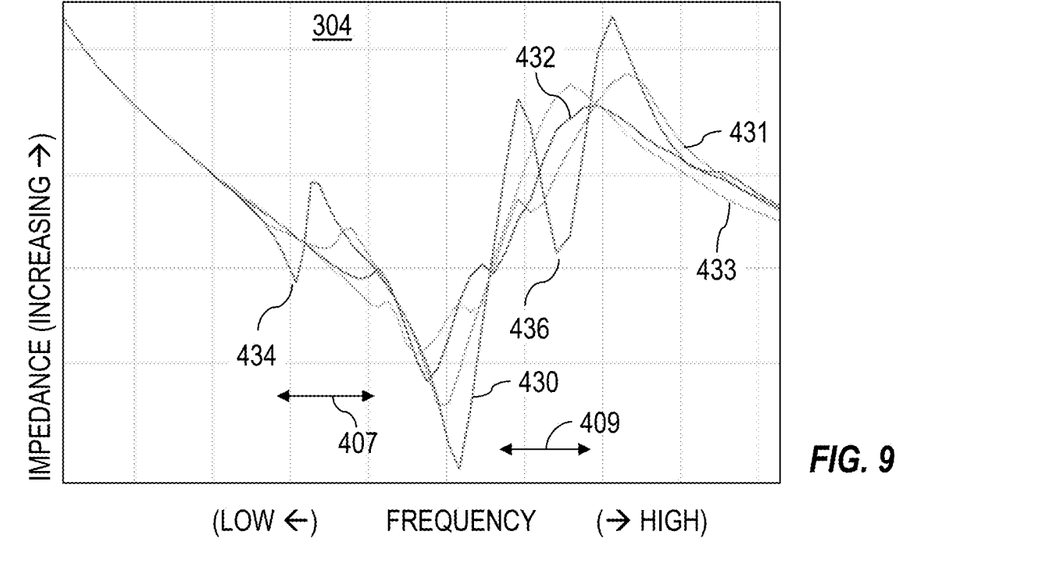
FIG. 9 is a graph depicting one or more aspects of the present disclosure.

In other words, each piezoelectric element 422 of the transducer 420 has a first axial end 424 and a second axial end 426, wherein the second axial end 426 is wider than the first axial end 424 in a direction 421 along a circumference of the transducer 420 (e.g., across the page in FIG. 8A). An outer-rectangular shape can be realized by taking a set of circumferential elements indicated in the horizontal range 421 as a representative of the transducer segment 210 depicted in FIG. 3. Other elemental patterns are also within the scope of the present disclosure as are patterns that lead to non-rectangular outer shapes. The impedance curves depicted in FIG. 9 are numerical simulations for different values of a parameter "pp" that is the difference between the first 424 and second 426 axial ends varying from the minimum pp value of 0 to the maximum value of 66 percent by 22 percent increment, as examples. The corresponding four impedance curves 430, 431, 432, 433 are presented in FIG. 9 in the order of the pp values. The impedance curves depicted in FIG. 9 indicate that the amplitude of the parasitic mode is greatly reduced by this reshaping of the elements 422, comparing two curves (432, 433) at the pp values respectively at 44 and 66 percent to the curve at pp value at 0 percent 430.

Figure 3:
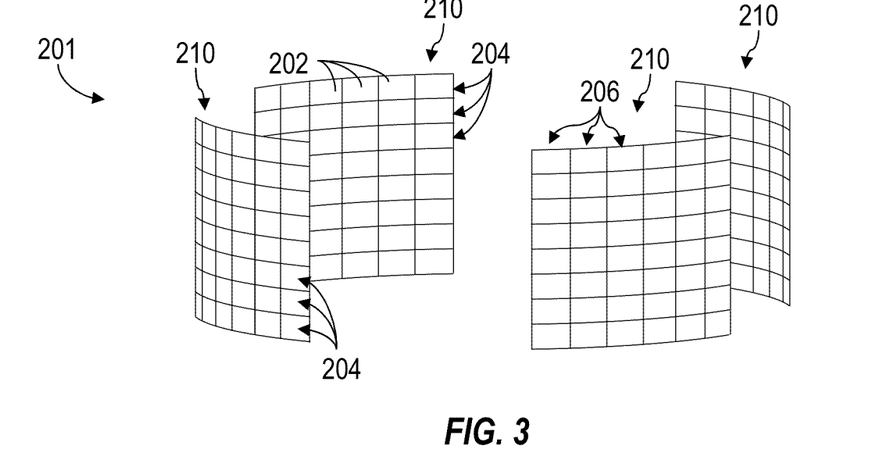
FIG. 3 is a perspective view of another example implementation of the apparatus shown in FIG. 2.

The piezoelectric elements 422 may be positioned azimuthally around one or more portions of a circumference of the transducer, similar to as shown in FIG. 3. The piezoelectric elements 422 may instead be azimuthally distributed around the full circumference of tool, similar to as shown in FIG. 2.

Each piezoelectric element 422 may be elongated in a direction 440 parallel to a longitudinal axis of the downhole acoustic measurement tool 138 and/or the central axis 208 of the transducer 420. An axial length 442 of each piezoelectric element 422 is may be some factor larger than an average width of the first 424 and second 426 axial ends. For example, each first axial end 424 may have a width 444 of 50 percent and each second axial end 426 may have a width 446 of 150 percent, such that the average width of each element 422 is 100 percent. Aforementioned dimensions are merely examples and other dimensions are also within the scope of the present disclosure, as are paired elemental widths that do not average to 100 percent, for example when combining the trapezoidal shape with the below presented random elemental width.

In this particular example, each neighboring pair of the piezoelectric elements 422 includes a first piezoelectric element 422a and a second piezoelectric element 422b, such that the first axial end 424 of each first piezoelectric element 422a is at an upper end 448 of the transducer 420 and the first axial end 424 of each second piezoelectric element 422b is at a lower end 450 of the transducer 420. Also in this particular example, each piezoelectric element 422 includes a radially outer edge 452 extending parallel to the longitudinal axis 208 of the transducer 420. Thus, a radially outward surface of each piezoelectric element 422 may form a right trapezoid. Other implementations with non-parallel edges or non-uniform upper and lower transducer endings are also within the scope of the present disclosure.

When inspecting casing or production tubing with an acoustic (e.g., ultrasonic) phased array transducer disposed in the circumference of a cylindrical tool, it is possible to fire the phased array elements in different apertures and then combine several types of measurements. The piezoelectric elements are excited on their thickness to produce the intended signal. By cutting such active area in sub-elements or segment that consists of at least one element, parasitic modes are occurring in the other dimensions different from the thickness, e.g. the width, in other words, tool circumference or lateral direction. Typically, the modes induced by the width of the elements can be interfering with the modes related to their thickness. This can be addressed by one or more aspects described above.

Other unintended modes are also related to the pattern of the array which is periodic and presents an interference other than the one attributed to the lateral mode of the single element. Such an unintended mode may be related to Lamb and leaky modes (or interface modes), propagating in a lateral direction of the periodic phased array and interfacing with well fluid. The characteristic propagation speeds and energies are modulated by the periodicity of the phased array. Such modes can be transmitted into the fluid as a result of mode conversions at the piezoelectric and inter-element boundaries due to acoustic impedance discontinuities, and may deteriorate phased array signals for resonant target characterizations, such as downhole cement evaluation applications using casing resonance analysis, as described in U.S. Pat. No. 5,216,638. The following description pertains to aspects directed to reducing the influence of such interference by adding an "alea", which is defined as a "randomness" or "perturbation" to the pitch, and is intended to break the periodicity of the array.

Lamb modes are well known to be present in parts presenting plate geometries, plane or cylindrical. These can be symmetric or antisymmetric.

Figure 10:
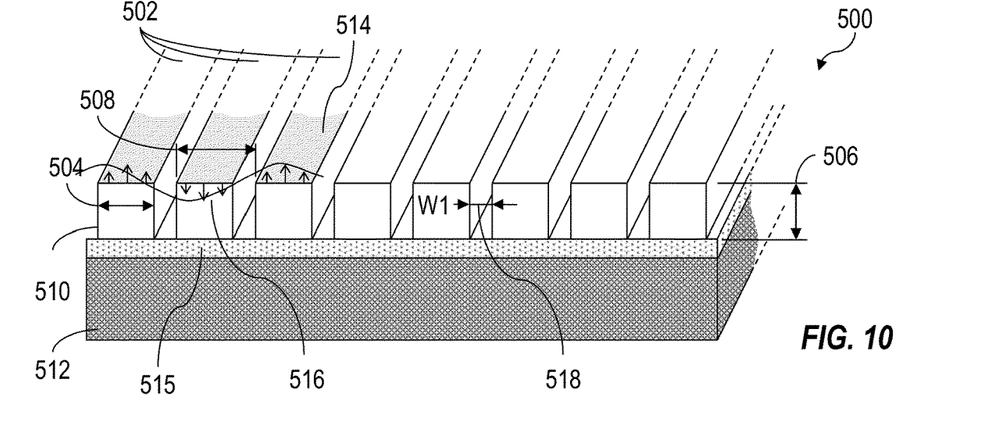
FIG. 10 is a perspective view of an example implementation of the apparatus shown in FIG. 6.

FIG. 10 is a perspective view of a portion of a transducer 500 that is similar to the transducer 400 shown in FIGS. 6 and 7. The transducer 500 has a periodic structure with rectangular piezoelectric elements 502 each having a constant width 504 and a thickness 506. The elements 502 are disposed with a constant pitch 508. The elements 502 extend from a backing 512. Between the elements 502 and the backing 512, an interface layer 515 that consists of one or more materials may be present.

A measurement of the radial displacement 516 at the front face 514 of the array of elements 502 shows the deformation of the array when an element is excited, and shows that this deformation is related to the pattern of the pitch 508. As such pattern is perfectly periodic, a very sharp interference may appear in the frequency range 310. This can be resolved by modifying the pitch 508 by introducing an "alea" (defined as a fraction of the pitch preferably in the order of several percent to several 10 percent) that is distributed randomly or deterministically between the elements 502 while maintaining the average pitch 508 across the array. The displacement 516 depicted is merely for an example, and may vary in the interested frequency range of interest 310, defined by the lower and upper limits respectively $F_{LL}$ and $F_{UL}$.

Figure 11:
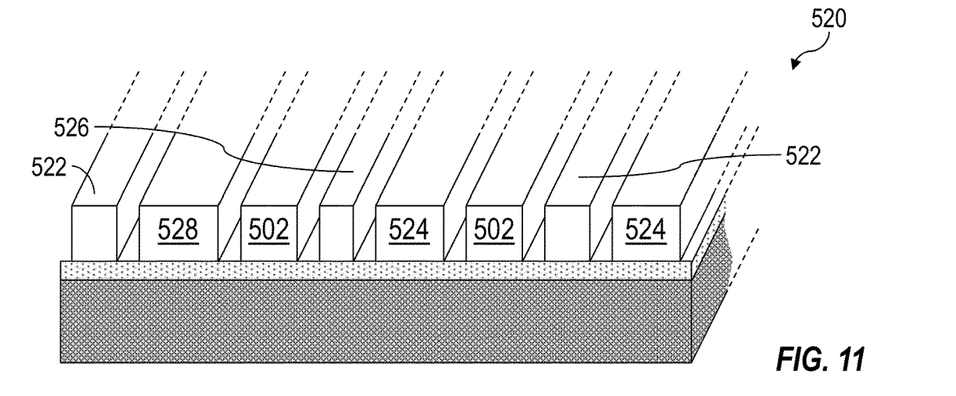
FIG. 11 is a perspective view of another example implementation of the apparatus shown in FIG. 10.

FIG. 11 depicts an example implementation of such a transducer 520, in which two of the elements 502 have the 100% of the original rectangular element width 504, while two elements 522 have a width of about 78 percent of the original width 504, two elements 524 have a width of about 122 percent of the original width 504, one element 526 has a width of 61 percent of the original width 504, and one element 528 has a width of 139 percent of the original width 504. The spacing between each neighboring element remains the same as in FIG. 10. Moreover, the average pitch 508 and width 504 of the elements of the array remains the same as for the transducer 500 shown in FIG. 10.

The objective is to randomize or distribute differently the structure to minimize the excitation mode related to the periodic array. Since the pitch is no longer aligned with the deformation profile of the Lamb mode, resulting sharp interference peaks (similar in appearance for example to the peaks 434, 436 in the sub-frequency ranges 407, 409) will be spread over a wider band in the spectrum, and its impact will therefore be largely reduced, again similar to the impact on the impedance curves presented in FIG. 9.

The piezoelectric elements 502, 522, 524, 526, 528 may be irregularly pitched azimuthally around one or more portions of a circumference of the tool, similar to as shown in FIG. 3, or irregularly pitched fully around the circumference of the tool, similar to as shown in FIG. 2. The axial length of each piezoelectric element 502, 522, 524, 526, 528 may be some factor larger than an average width of the piezoelectric elements 502, 522, 524, 526, 528. One or more of the piezoelectric elements 502, 522, 524, 526, 528 may be trapezoidal or otherwise non-rectangular as described above with respect to FIG. 8A. As described below, the piezoelectric elements 502, 522, 524, 526, 528 may be spaced apart by a distance that is typically some factor smaller than the element width as detailed below.

Parasitic modes visible on the response of a transducer as described herein can also be reduced by using an inter-element spacing that is thinner than the one used on a transducer that presents such parasitic modes. The presence of parasitic modes in the piezoelectric elements of the transducer disturbs the characterization of the resonance of the casing.

Figure 12:
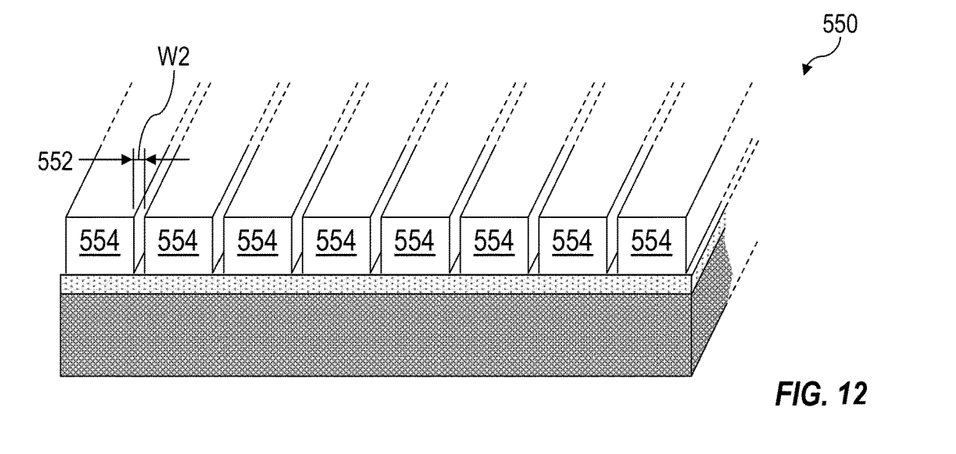
FIG. 12 is a perspective view of another example implementation of the apparatus shown in FIG. 10.

The interelement spacing in the transducer 500 shown in FIG. 10 has the value of W1. FIG. 12 depicts an example implementation of a similar transducer 550 with a thinner interelement spacing 552 of W2 (W2<W1) which permits an increase of the width of the elements 554 by (W1−W2), while pitch and thickness remain the same.

The thinner interelement spacing reduces the consequences of parasitic modes. For example, whereas the wider interelement spacing may provide a clear resonance in the frequency band of interest 310 used to process the pulse-echo signal, the thinner interelement may push the parasitic mode out of the frequency band of interest.

If we consider N a frequency constant linked to this parasitic mode, it can be determined as: $N=(d_{ie})(f_{ie})$. Considering the implementation depicted in FIG. 10, if the interelement spacing ($d_{ie}$=W1) is generating a perturbation at $f_{ie}$=f1, then N=f1*W1. However, considering the implementation depicted in FIG. 12, the thinner interelement spacing of $d_{ie}$=W2 with same constant N raises the frequency of perturbation to $f_{ie}$=f1*W1/W2. To push this parasitic mode frequency outside of the upper limit of the frequency band of interest $F_{UL}$, W2 can be determined as W2<W1*f1/$F_{UL}$. This thinner interelement spacing may also be utilized with the non-rectangular and/or irregularly pitched implementations described above.

The phased array can have several configurations. In one or more embodiments, the phased array can include a thin inter-element located between adjacent piezoelectric elements. The each piezoelectric elements can have a shape of a right trapezoid, a isosceles trapezoid, or rectangular. The pitch of the piezoelectric elements can be irregularly pitched azimuthally around one or more portions of a circumference of the transducer or can be pitched regularly around the circumference of the transducer at a predetermined pitch. In one or more embodiments, the piezoelectric elements can be aligned at their edge in an even fashion or in an uneven fashion. In one or more embodiments, piezoelectric elements can be in a 1 dimensional or 2 dimensional fashion.

In one none limiting example, the phased array can include piezoelectric elements with a thin inter-element located therebetween, the piezoelectric elements can have a right trapezoid shape, the piezoelectric elements can be irregularly pitched azimuthally around one or more portions of a circumference of the transducer, the edges of the piezoelectric elements can be evenly aligned, and they can be arranged in a 1 D fashion. In another embodiment, the piezoelectric elements can be unevenly aligned at their edge In another none limiting example, the phased array can include rectangular shaped piezoelectric elements that are irregularly pitched azimuthally around one or more portions of a circumference of the transducer, and the edges of the piezoelectric elements can be evenly aligned at their edge. The piezoelectric elements can be arranged in a 1 dimensional fashion. In another embodiment, the piezoelectric elements can be unevenly aligned at their edge In another none limiting example, the phased array can include rectangular shaped piezoelectric elements that are regularly pitched azimuthally around one or more portions of a circumference of the transducer, and the edges of the piezoelectric elements can have an evenly alignment at their edge. The piezoelectric elements can be arranged in a 1 dimensional fashion. In another embodiment, the piezoelectric elements can be unevenly aligned at their edge In another none limiting example, the phased array can include rectangular shaped piezoelectric elements that are irregularly pitched azimuthally around one or more portions of a circumference of the transducer, and the edges of the piezoelectric elements can be unevenly aligned at their edge. The piezoelectric elements can be arranged in a 1 dimensional fashion. In one or more embodiments, the piezoelectric elements can have an evenly alignment at their edge. In one none limiting example, the phased array can include piezoelectric elements with a thin inter-element located therebetween, the piezoelectric elements can have a right trapezoid shape, the piezoelectric elements can be regularly pitched azimuthally around one or more portions of a circumference of the transducer, the edges of the piezoelectric elements can be unevenly aligned, and they can be arranged in a 1 D fashion. In another embodiment, the piezoelectric elements can be evenly aligned at their edge.

In one or more embodiments, the piezoelectric elements can include an thin inter-element, have an isosceles trapezoid shape, one of a random pitch or an unique pitch, and one of and even or uneven edge alignment. In any of the foregoing examples, the piezoelectric elements can isosceles trapezoidal in shape, right trapezoidal in shape, or rectangular in shape. Furthermore, in any of the foregoing examples, the phased array can include piezoelectric elements arranged in a 2 dimensional fashion.

In one or more embodiments an apparatus can include a downhole acoustic measurement tool that has a transducer. The transducer is operable for emitting and/or receiving acoustic signals to perform downhole measurements. The transducer has a plurality of piezoelectric elements. Each of the piezoelectric elements has a first axial end and a second axial end, and the second axial end is one of wider than the first axial end or equal to the first axial end in a direction along a circumference of the transducer.

In one or more embodiments of the foregoing apparatus, the piezoelectric elements are positioned azimuthally around one or more portions of a circumference of the transducer.

In one or more embodiments of the foregoing apparatus, the piezoelectric elements are azimuthally distributed around a circumference of the transducer.

In one or more embodiments of the foregoing apparatus, each piezoelectric element is elongated in a direction parallel to a longitudinal axis of the downhole acoustic measurement tool, wherein an axial length of each piezoelectric element is larger than an average width of first and second axial ends. In one or more embodiments of the foregoing apparatus, the piezoelectric elements are irregularly pitched azimuthally around one or more portions of a circumference of the transducer. In one or more embodiments of the foregoing apparatus, the piezoelectric element has a first width L0 at a first end and L1 at a second end, and wherein L0 is one of equal to L1, greater than L1, or less than L1.

In one or more embodiments of the foregoing apparatus, each neighboring pair of the piezoelectric elements includes a first piezoelectric element and a second piezoelectric element. The first axial end of each first piezoelectric element is at an upper end of the transducer; and the first axial end of each second piezoelectric element is at a lower end of the transducer. In one or more embodiments of the foregoing apparatus, each piezoelectric element includes a radially outer edge extending parallel to a longitudinal axis of the transducer. In one or more embodiments of the foregoing apparatus, a radially outward surface of each piezoelectric element forms a right trapezoid. In one or more embodiments of the foregoing apparatus, the piezoelectric elements are spaced apart by no more than the distance defined by $W1*f1/F_{UL}$, where $F_{UL}$ is the upper limit of the frequency band of interest, W1 is the width of the transducer interelement spacing that produces parasitic mode at frequency f1. In one or more embodiments of the foregoing apparatus, the piezoelectric elements are irregularly pitched azimuthally around one or more portions of a circumference of the transducer.

In another embodiment, the apparatus is a downhole acoustic measurement tool that has a transducer. The transducer is operable for emitting and/or receiving acoustic signals to perform downhole measurements, and the transducer comprises a plurality of piezoelectric elements. The piezoelectric elements are irregularly pitched azimuthally around one or more portions of a circumference of the transducer. the piezoelectric elements are irregularly pitched fully around the circumference of the transducer.

In one or more embodiments of the foregoing apparatus, each piezoelectric element is elongated in a direction parallel to a longitudinal axis of the downhole acoustic measurement tool, and wherein an axial length of each piezoelectric element is larger than an average width of the piezoelectric elements.

In one or more embodiments of the foregoing apparatus, the piezoelectric elements are irregularly pitched azimuthally around one or more portions of a circumference of the transducer.

In one or more embodiments of the foregoing apparatus, each neighboring pair of the piezoelectric elements includes a first piezoelectric element and a second piezoelectric element; and the first axial end of each first piezoelectric element is at an upper end of the transducer. The first axial end of each second piezoelectric element is at a lower end of the transducer.

In one or more embodiments of the foregoing apparatus, the piezoelectric elements are spaced apart by no more than the distance defined by $W1*f1/F_{UL}$, where $F_{UL}$ is the upper limit of the frequency band of interest, W1 is the width of the transducer interelement spacing that produces parasitic mode at frequency f1. In one or more embodiments of the foregoing apparatus, each piezoelectric element has a first axial end and a second axial end, and wherein the second axial end is wider than or equal to the first axial end in a direction along a circumference of the transducer, each piezoelectric element is elongated in a direction parallel to a longitudinal axis of the downhole acoustic measurement tool, and wherein an axial length of each piezoelectric element is larger than an average width of the piezoelectric elements, wherein the piezoelectric elements are spaced apart by no more than the distance defined by $W1*f1/F_{UL}$, where $F_{UL}$ is the upper limit of the frequency band of interest, W1 is the width of the transducer interelement spacing that produces parasitic mode at frequency f1, wherein the piezoelectric elements are irregularly pitched fully around the circumference of the transducer, or combinations thereof.

In another embodiments of the apparatus, the apparatus is a downhole acoustic measurement tool comprising a transducer. The transducer is operable for emitting and/or receiving acoustic signals to perform downhole measurements. The transducer includes a plurality of piezoelectric elements spaced apart by no more than the distance defined by $W1*f1/F_{UL}$, where $F_{UL}$ is the upper limit of the frequency band of interest, W1 is the width of the transducer interelement spacing that produces parasitic mode at frequency f1. In one or more embodiments of the foregoing apparatus, the piezoelectric elements are irregularly pitched azimuthally around one or more portions of a circumference of the transducer.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same functions and/or achieving the same benefits of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72 (b) to permit the reader to quickly ascertain the nature of the technical disclosure. It is submitted with the understanding that it will not be used to interpret or limit the scope or meaning of the claims.

What is claimed is:

1. An apparatus comprising:
   a downhole acoustic measurement tool comprising a transducer, wherein:
   the transducer is operable for emitting and/or receiving acoustic signals to perform downhole measurements;
   the transducer comprises a plurality of piezoelectric elements;
   the piezoelectric elements are spaced apart by no more than the distance defined by $W1*f1/F_{UL}$, where $F_{UL}$ is an upper limit of a frequency band of interest, and W1 is a width of the transducer interelement spacing that produces parasitic mode at frequency f1; and
   each piezoelectric element has a first axial end and a second axial end, wherein the second axial end is one of wider than the first axial end or equal to the first axial end in a direction along a circumference of the transducer.

2. The apparatus of claim 1 wherein the piezoelectric elements are positioned azimuthally around one or more portions of a circumference of the transducer.

3. The apparatus of claim 1 wherein the piezoelectric elements are azimuthally distributed around a circumference of the transducer.

4. The apparatus of claim 1 wherein each piezoelectric element is elongated in a direction parallel to a longitudinal axis of the downhole acoustic measurement tool, wherein an axial length of each piezoelectric element is larger than an average width of first and second axial ends.

5. The apparatus of claim 1 wherein the piezoelectric elements are irregularly pitched azimuthally around one or more portions of a circumference of the transducer.

6. The apparatus of claim 1, wherein each piezoelectric element has a first width L0 at a first end and L1 at a second end, and wherein L0 is one of equal to L1, greater than L1, or less than L1.

7. The apparatus of claim 1 wherein:
each neighboring pair of the piezoelectric elements includes a first piezoelectric element and a second piezoelectric element;
the first axial end of each first piezoelectric element is at an upper end of the transducer; and
the first axial end of each second piezoelectric element is at a lower end of the transducer.

8. The apparatus of claim 6 wherein each piezoelectric element includes a radially outer edge extending parallel to a longitudinal axis of the transducer.

9. The apparatus of claim 1 wherein a radially outward surface of each piezoelectric element forms a right trapezoid.

10. An apparatus comprising:
a downhole acoustic measurement tool comprising a transducer, wherein:
the transducer is operable for emitting and/or receiving acoustic signals to perform downhole measurements;
the transducer comprises a plurality of piezoelectric elements;
the piezoelectric elements are spaced apart by no more than the distance defined by $W1*f1/F_{UL}$, where $F_{UL}$ is an upper limit of a frequency band of interest, and W1 is a width of the transducer interelement spacing that produces parasitic mode at frequency f1; and
the piezoelectric elements are irregularly pitched azimuthally around one or more portions of a circumference of the transducer.

11. The apparatus of claim 10 wherein the piezoelectric elements are irregularly pitched fully around the circumference of the transducer.

12. The apparatus of claim 10 wherein each piezoelectric element is elongated in a direction parallel to a longitudinal axis of the downhole acoustic measurement tool, and wherein an axial length of each piezoelectric element is larger than an average width of the piezoelectric elements.

13. The apparatus of claim 10 wherein: each neighboring pair of the piezoelectric elements includes a first piezoelectric element and a second piezoelectric element; a first axial end of each first piezoelectric element is at an upper end of the transducer; and a first axial end of each second piezoelectric element is at a lower end of the transducer.

14. The apparatus of claim 10 wherein each piezoelectric element has a first axial end and a second axial end, and wherein the second axial end is wider than or equal to the first axial end in a direction along a circumference of the transducer, each piezoelectric element is elongated in a direction parallel to a longitudinal axis of the downhole acoustic measurement tool, wherein an axial length of each piezoelectric element is larger than an average width of the piezoelectric elements, and wherein the piezoelectric elements are irregularly pitched fully around the circumference of the transducer.

15. An apparatus comprising:
a downhole acoustic measurement tool comprising a transducer, wherein:
the transducer is operable for emitting and/or receiving acoustic signals to perform downhole measurements; and
the transducer comprises a plurality of piezoelectric elements spaced apart by no more than the distance defined by $W1*f1/F_{UL}$, where $F_{UL}$ is an upper limit of a frequency band of interest, and W1 is a width of the transducer interelement spacing that produces parasitic mode at frequency f1.

16. The apparatus of claim 15 wherein the piezoelectric elements are positioned azimuthally around one or more portions of a circumference of the transducer.

17. The apparatus of claim 15 wherein the piezoelectric elements are azimuthally distributed around a circumference of the transducer.

* * * * *